United States Patent
Landru et al.

(10) Patent No.: US 9,136,113 B2
(45) Date of Patent: Sep. 15, 2015

(54) PROCESS TO DISSOLVE THE OXIDE LAYER IN THE PERIPHERAL RING OF A STRUCTURE OF SEMICONDUCTOR-ON-INSULATOR TYPE

(71) Applicant: SOITEC, Bernin (FR)

(72) Inventors: Didier Landru, Champ Prés Froges (FR); Fabrice Gritti, Voiron (FR); Eric Guiot, Goncelin (FR); Oleg Kononchuk, Grenoble (FR); Christelle Veytizou, Bernin (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/044,846

(22) Filed: Oct. 2, 2013

(65) Prior Publication Data

US 2014/0030877 A1 Jan. 30, 2014

Related U.S. Application Data

(63) Continuation of application No. 13/145,313, filed as application No. PCT/EP2009/068014 on Dec. 30, 2009.

(30) Foreign Application Priority Data

Jan. 22, 2009 (FR) ...................... 09 50389

(51) Int. Cl.
*H01L 21/461* (2006.01)
*H01L 21/02* (2006.01)
(Continued)

(52) U.S. Cl.
CPC .... *H01L 21/02532* (2013.01); *H01L 21/02238* (2013.01); *H01L 21/02255* (2013.01);
(Continued)

(58) Field of Classification Search
CPC .............. H01L 21/02238; H01L 21/02255; H01L 21/31662; H01L 21/02532; H01L 21/7624; H01L 21/02422; H01L 21/324
USPC ......................................... 438/778
See application file for complete search history.

(56) References Cited

U.S. PATENT DOCUMENTS

| | | | |
|---|---|---|---|
| 5,233,218 A | 8/1993 | Miura | 257/618 |
| 6,232,201 B1 | 5/2001 | Yoshida et al. | 438/423 |

(Continued)

FOREIGN PATENT DOCUMENTS

| | | |
|---|---|---|
| EP | 1 487 012 A2 | 12/2004 |
| EP | 1 542 275 A1 | 6/2005 |

(Continued)

OTHER PUBLICATIONS

International Search Report, Appl. No. PCT/EP2009/068014, Apr. 15, 2010.

(Continued)

*Primary Examiner* — Shaun Campbell
(74) *Attorney, Agent, or Firm* — TraskBritt

(57) ABSTRACT

A process for avoiding formation of an $Si$—$SiO_2$—$H_2$ environment during a dissolution treatment of a semiconductor-on-insulator structure that includes a carrier substrate, an oxide layer, a thin layer of a semiconductor material and a peripheral ring in which the oxide layer is exposed. This process includes encapsulating at least the exposed oxide layer of the peripheral ring with semiconductor material by performing a creep thermal treatment; and performing an oxide dissolution treatment to reduce part of the thickness of the oxide layer. In this process, the semiconductor material that encapsulates the oxide layer has a thickness before the oxide dissolution that is at least twice that of the oxide that is to be dissolved, thus avoiding formation of an $Si$—$SiO_2$—$H_2$ environment on the peripheral ring where the oxide layer would otherwise be exposed.

18 Claims, 3 Drawing Sheets

(51) Int. Cl.
  H01L 21/316    (2006.01)
  H01L 21/324    (2006.01)
  H01L 21/762    (2006.01)

(52) U.S. Cl.
  CPC .... H01L21/02422 (2013.01); H01L 21/31662 (2013.01); H01L 21/324 (2013.01); H01L 21/7624 (2013.01)

(56) References Cited

U.S. PATENT DOCUMENTS

| | | | |
|---|---|---|---|
| 6,939,783 B2 | 9/2005 | Neyret et al. | 438/455 |
| 7,138,344 B2 | 11/2006 | Neyret et al. | 438/799 |
| 7,190,029 B2 | 3/2007 | Neyret et al. | 257/347 |
| 2004/0106303 A1 | 6/2004 | Neyret et al. | 438/799 |
| 2006/0128078 A1 | 6/2006 | Moriwaki et al. | 438/149 |
| 2006/0154442 A1* | 7/2006 | de Souza et al. | 438/455 |
| 2008/0149980 A1 | 6/2008 | Govindarajan | 257/306 |
| 2009/0032911 A1 | 2/2009 | Kononchuk | 257/647 |

FOREIGN PATENT DOCUMENTS

| | | | |
|---|---|---|---|
| FR | 2 845 202 A1 | 4/2004 | |
| FR | 2 852 143 A1 | 9/2004 | |
| WO | 2007048928 A1 | 5/2007 | |
| WO | WO 2008/033508 A2 | 3/2008 | |
| WO | WO 2008/114099 A1 | 9/2008 | |

OTHER PUBLICATIONS

Bertrand et al., "Dynamics of dewetting," Colloids and Surfaces A: Physiochemical and Engineering Aspects, 369(1-2):141-147 (Oct. 20, 2010).

Bussmann et al., "Thermal instability of silicon-on-insulator thin films measured by low-energy electron microscopy," IOP Conference Series: Materials Science and Engineering, 12(1):1-4 (Jul. 2010).

Danielson, "Anisotropic Dewetting in Ultra-Thin Single-Crystal Silicon-on-Insulator Films," Theses, Dept. of Materials Science and Engineering, (2008) http://dspace.mit.edu/handle/1721.1/43805.

Dornel et al., "Surface diffusion dewetting of thin solid films: Numerical method and application to $Si/SiO_2$," Physical Review B, 73:115427-1-115427-10 (2006).

Flack et al., "Pattern Formation on Silicon-on-Insulator," Mater. Res. Soc. Symp. Proc., 849, 9 pages (2005).

Ishikawa et al., "Effect of patterning on thermal agglomeration of ultrathin silicon-on-insulator layer," Applied Surface Science, 190(1-4):11-15 (May 8, 2002).

Jahan et al., "Agglomeration control during the selective epitaxial growth of Si raised sources and drains on ultra-thin silicon-on-insulator substrates," Journal of Crystal Growth, 280(3-4):530-538 (Jul. 1, 2005).

Kononchuk et al., "Internal Dissolution of Buried Oxide in SOI Wafers," Solid State Phenomena, 131-133:113-118 (2008).

Ludsteck et al., "Growth model for thin oxides and oxide optimization," Journal of Applied Physics, 95(5):2827-2831 (Mar. 1, 2004).

Nuryadi et al., "Formation and ordering of self-assembled Si islands by ultrahigh vacuum annealing of ultrathin bonded silicon-on-insulator structure," Applied Surface Science, 159-160:121-126 (Jun. 2000).

Nuryadi et al., "Thermal agglomeration of single-crystalline Si layer on buried $SiO_2$ in ultrahigh vacuum," Journal of Vacuum Science & Technology B, 20(1):167-172 (Jan./Feb. 2002).

U.S. Appl. No. 13/145,313, filed on Jul. 19, 2011.
U.S. Appl. No. 13/145,313, Non-Final Office Action, Mar. 11, 2013.
U.S. Appl. No. 13/145,313, Final Office Action, Jul. 5, 2013.

* cited by examiner

PROCESS TO DISSOLVE THE OXIDE LAYER IN THE PERIPHERAL RING OF A STRUCTURE OF SEMICONDUCTOR-ON-INSULATOR TYPE

CROSS-REFERENCE TO RELATED APPLICATIONS

This application is a continuation of U.S. patent application Ser. No. 13/145,313, filed Jul. 19, 2011, abandoned, which is the 371 filing of International Patent Application PCT/EP2009/068014 filed Dec. 30, 2009, designating the United States of America and published in English as International Patent Publication WO 2010/083933 A1 on Jul. 29, 2010, which claims priority to French Patent Application Serial No. FR 0950389, filed Jan. 22, 2009, the disclosure of each of which is hereby incorporated herein in its entirety by this reference.

TECHNICAL FIELD

The present invention concerns a process of treating a structure of semiconductor-on-insulator (SOI) type successively comprising a carrier substrate, an oxide layer and a thin layer of semiconductor material and, more particularly, a treatment process with which it is possible to avoid delaminating the semiconductor layer during thermal treatment to dissolve the oxides.

BACKGROUND

In the area of structures of semiconductor-on-insulator (SOI) type, it is known to apply thermal treatment to cause diffusion of at least part of the oxygen from the buried oxide layer through the thin semiconductor layer, so as to reduce or eliminate the thickness of this oxide layer.

This dissolution step can be applied to the entire structure, or it can be applied locally, i.e., to dissolve the oxide layer—in whole or in part—in determined regions of the SOI structure, corresponding to a desired pattern, while preserving the initial oxide layer in the other regions. This is termed "local dissolution" of the oxide layer.

The application of this dissolution thermal treatment or of any other type of thermal treatment, such as surface smoothing or an epitaxy step, may cause a phenomenon of de-wetting as mentioned in document WO 2007/048928. It was observed by the inventors of the present invention that this phenomenon was particularly triggered on the periphery of the structure and, more generally, at every point in the structure in which the buried oxide is exposed, i.e., in contact with the outside, or at every point in which the thin layer is so thin (a few tens of nanometers or less) that it becomes morphologically unstable when the structure is brought to high temperature, thereby exposing the buried oxide.

This de-wetting phenomenon is greater the thinner the thickness of the thin layer (for example, less than 100 nm).

It is accompanied by a phenomenon of etching of the buried oxide if this oxide is exposed to the treatment atmosphere and in contact with the thin layer in Si, for example, as per the reaction:

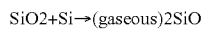

$$SiO_2 + Si \rightarrow (gaseous) 2SiO$$

At the "three-point" contact of Si/SiO2/treatment atmosphere, the buried oxide (SiO2) reacts with the silicon of the thin layer to form volatile SiO complexes, which are carried into the treatment atmosphere.

It is recalled that in substrates of semiconductor-on-insulator (SOI) type obtained by bonding, there is no bonding on the edge of the assembled substrates on account of the presence of peripheral chamfers on the contacted surfaces. Therefore, after transfer of the thin layer, in silicon, for example, the final substrate has a peripheral ring in which transfer did not take place and at which the buried oxide is exposed.

Phenomena of de-wetting and etching, which may occur during thin layer thermal treatments, lead to an extensive defective region over a distance of up to 1 cm on the periphery of the substrate when this substrate is exposed to thermal treatment, e.g., dissolution thermal treatment.

This defectiveness may also occur at any other point of the starting substrate, at which the buried oxide is directly exposed or lies under a thin layer of reduced thickness. The defect is possibly a through defect (also called "HF defect") in the thin layer and, therefore, exposes the buried oxide to the treatment atmosphere. It may concern regions of the substrate in which the thin layer is of much narrower thickness than the mean thickness of this layer, making exposure of the buried oxide to the treatment atmosphere possible if the thickness of the thin layer should be reduced during treatment.

These phenomena make the substrate unfit for uses in the usual areas of application of these substrates, such as the fabrication of electronic components (e.g., "memory" and "logic" components), in the regions in which such defects occur. Thus, improvements in these types of components are needed.

BRIEF SUMMARY

This disclosure overcomes this disadvantage by proposing a process of simple design and low cost to obtain a structure of semiconductor-on-insulator (SOI) type not comprising any de-wetting or etch phenomena, at least on all or part of its periphery.

For this purpose and according to the invention, a process is disclosed that treats a structure of semiconductor-on-insulator type, which successively comprises a carrier substrate, an oxide layer and a thin layer of semiconductor material, the structure having a peripheral ring in which the oxide layer is exposed, the process comprising the application of a main thermal treatment in a neutral or controlled reducing atmosphere, the process being noteworthy in that it comprises at least one step to cover at least an exposed peripheral part of the oxide layer prior to the main thermal treatment, the latter being conducted under controlled time and temperature conditions so as to urge at least part of the oxygen of the oxide layer to diffuse through the thin semiconductor layer, leading to controlled reduction of the thickness of the oxide layer.

The invention also relates to a process for avoiding formation of an Si—SiO$_2$—H$_2$ environment during a dissolution treatment of a semiconductor-on-insulator structure successively comprising a carrier substrate, an oxide layer, a thin layer of semiconductor material and a peripheral ring in which the oxide layer is exposed. This process comprises encapsulating at least the exposed oxide layer of the peripheral ring with semiconductor material by performing a creep thermal treatment; and performing an oxide dissolution treatment to reduce part of the thickness of the oxide layer. In this process, the semiconductor material that encapsulates the oxide layer has a thickness before the oxide dissolution that is at least twice that of the oxide that is to be dissolved, thus avoiding formation of an Si—SiO$_2$—H$_2$ environment on the peripheral ring where the oxide layer would otherwise be exposed.

By the expression "at least an exposed peripheral part of the oxide layer" is meant that the regions in the proximity of the exposed part of buried oxide are also covered in which the thin layer is of very narrow thickness. This thickness will come to be reduced during thermal treatment, which means that the underlying oxide layer could be exposed or become morphologically unstable during treatment. Therefore, with annealing at 1100° C., advantageously, provision must be made for at least 10 nm of layer over the oxide, and at 1200° C., provision is advantageously made for at least 50 nm of layer over the oxide in the vicinity of the periphery.

According to advantageous, non-limiting characteristics of this process:
  the main thermal treatment is a smoothing thermal treatment;
  additional thermal treatment, called "creep treatment," is applied directly before the main thermal treatment to cause creep of the semiconductor layer over the exposed peripheral part of the oxide layer;
  creep thermal treatment is carried out by very rapid application of thermal treatment at a final temperature in the order of 1200° C.;
  creep thermal treatment is conducted at the final temperature for a time of less than 3 minutes;
  creep thermal treatment is performed with a temperature rise of more than 20° C./second, preferably in the order of 50° C./second;
  the oxide layer has a thickness in the region of 10 nm, while the thin layer has a thickness at least ten times greater;
  creep thermal treatment is conducted in a hydrogen and/or argon atmosphere;
  prior to the main thermal treatment and/or after the creep thermal treatment, a mask is formed on the exposed peripheral part of the buried oxide;
  the mask is formed locally on the semiconductor layer to allow local dissolution during the thermal treatment step;
  the layer of semiconductor material is in silicon;
  the oxide layer is in silicon oxide.

BRIEF DESCRIPTION OF THE DRAWINGS

Other advantages and characteristics of the invention will become better apparent from the following description of several variants of the embodiment, given as non-limiting examples of the process conforming to the invention, with reference to the appended drawings in which.

DETAILED DESCRIPTION OF THE INVENTION

Figure 1:
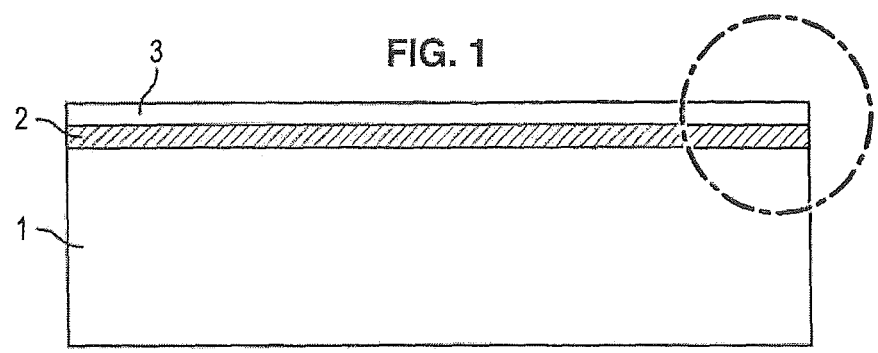
FIG. 1 illustrates a structure of semiconductor-on-insulator type prior to oxide dissolution treatment according to the invention.

With reference to FIG. 1, a dissolution treatment, described in detail below, is applied to a structure of semiconductor-on-insulator (SOI) type, successively comprising from its base toward its surface a carrier substrate 1, an oxide layer 2, and a semiconductor layer 3.

The carrier substrate 1 essentially acts as stiffener for the SOI structure.

For this purpose, it typically has a thickness in the order of a few hundred micrometers.

The carrier substrate 1 can be a bulk substrate or a composite substrate, i.e., consisting of a stack of at least two layers of different materials.

The carrier substrate 1 may, for example, comprise one of the following materials: Si, Ge, SiGe, GaN, sapphire.

The semiconductor layer 3 comprises at least one semiconductor material such as Si, Ge, or SiGe.

The semiconductor layer 3 may optionally be composite, i.e., consisting of a stack of layers of semiconductor materials.

The material of the semiconductor layer 3 may be single-crystalline, polycrystalline, or amorphous. It may or may not be porous and may or may not be doped.

In a particularly advantageous manner, the semiconductor layer 3 is adapted to receive electronic components.

The thin semiconductor layer 3 has a thickness of less than 5000 Å, and preferably less than 2500 Å to allow sufficiently rapid diffusion of the oxygen. The thicker the semiconductor layer 3, the slower the rate of dissolution of the oxide.

The diffusion of oxygen through a semiconductor layer 3 of thickness greater than 5000 Å is very slow, and on this account, gives little advantage at industrial level.

The oxide layer 2 is buried in the structure between the carrier substrate 1 and the semiconductor layer 3; it is, therefore, generally designated in the trade under the acronym BOX, for Buried Oxide Layer.

The SOI structure is fabricated using any layering technique involving bonding known to the person skilled in the art.

Amongst these techniques, mention may be made of the SMARTCUT® process (registered trademark), which chiefly comprises the following steps:
  i) forming an oxide layer 2 on the carrier substrate 1 or on a donor substrate containing the semiconductor layer 3,
  ii) forming a weakened region in the donor substrate, the weakened region defining the thin semiconductor layer 3 to be transferred,
  iii) bonding the donor substrate onto the carrier substrate, the oxide layer 2 being positioned at the bonding interface, and
  iv) splitting the donor substrate along the weakened region to transfer the thin semiconductor layer 3 onto the carrier substrate 1.

This technique is known to the person skilled in the art and will, therefore, not be further described herein. It is referred, for example, to: "Silicon-On-Insulator Technology Materials to VLSI, 2$^{nd}$ Ed." by Jean-Pierre Colinge, Kluwer Academic Publishers, pp. 50 and 51.

It is also possible to use a technique consisting of bonding, onto the carrier substrate 1, a donor substrate comprising the semiconductor layer 3, one and/or the other of the substrates being coated with an oxide layer 2, then of reducing the thickness of the donor substrate via its back face so as only to leave the thin semiconductor layer 3 on the carrier substrate 1.

The SOI substrate obtained can then be subjected to conventional finishing treatments (polishing, planarizing, cleaning, etc.).

In these processes to form the SOI structure, the oxide layer 2 is formed on the donor substrate or on the carrier substrate 1 by thermal oxidation (in which case, the oxide is an oxide of the material of the substrate that underwent oxidation) or by deposit, e.g., of silicon oxide ($SiO_2$).

The oxide layer 2 can also be a native oxide layer, resulting from natural oxidation of the donor substrate and/or of the carrier substrate 1 in contact with the atmosphere.

On the other hand, tests performed on SOI structures obtained using the SIMOX process did not allow any oxide dissolution to be observed, which was attributed to an inferior oxide quality due to the method with which it was obtained. In this respect, reference may be made to the article by L. Zhong et al., Applied Physics Letters 67, 3951 (1995).

It is specified that before starting the bonding step, it is possible to conduct cleaning or plasma activation steps on one and/or the other of the surfaces in contact in order to enhance bonding energy, these steps being well known to the person skilled in the art.

To limit the duration of dissolution treatment and to facilitate the covering step, the oxide layer 2 of the SOI structure generally has a thin or ultrathin thickness, i.e., between 50 and 1000 Å, preferably between 100 and 250 Å.

Figure 2:
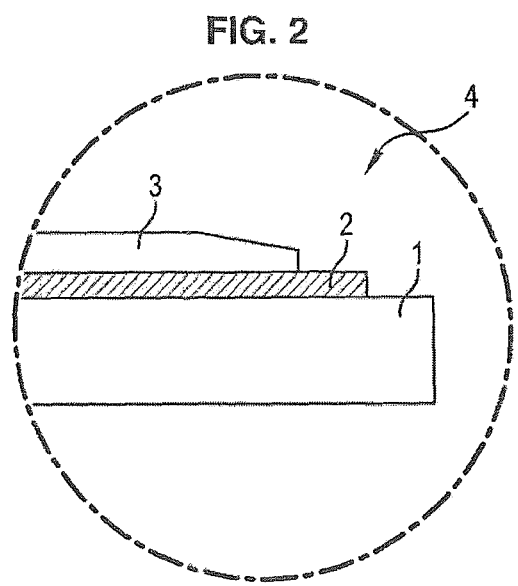
FIG. 2 is a detailed view of the ring of the structure of semiconductor-on-insulator type illustrated FIG. 1.

Also, with reference to FIG. 2, the SOI structure obtained using one of the above-described techniques has a so-called ring region 4 on its periphery in which the oxide layer 2, in particular, its flank, is exposed, i.e., part of the oxide layer 2 is in contact with the atmosphere. This ring 4 may extend over all or part of the periphery of the SOI structure.

Figure 3:
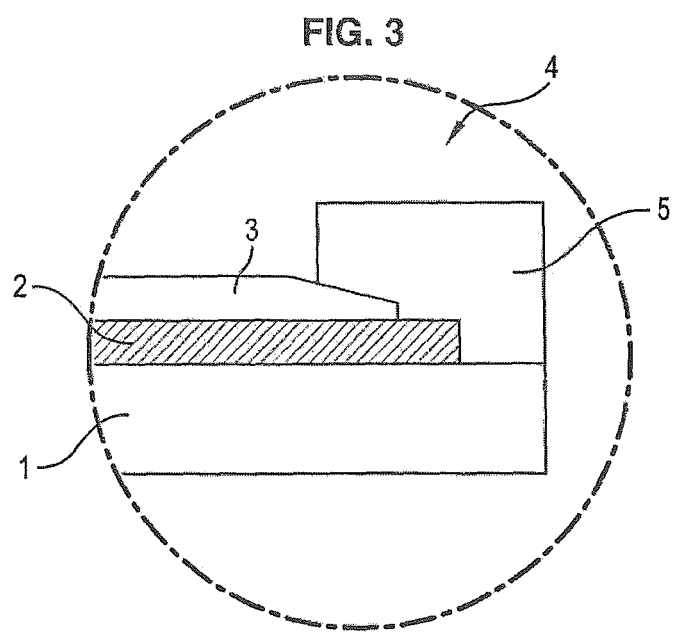
FIG. 3 illustrates one step in the treatment process of the structure according to the invention.

With reference to FIG. 3, the process of the invention consists of depositing a mask 5 on the ring 4 prior to the thermal dissolution treatment so that the oxide layer 2, in particular, its flank, is not in contact with the atmosphere.

Preferably, the mask 5 covers not only the exposed oxide but also the peripheral part of the semiconductor layer 3 that is thinned. The thickness of this layer effectively tends to be reduced during dissolution treatment. The presence of the mask on the periphery of the semiconductor layer (over a width of a few micrometers), therefore, makes it possible to prevent the oxide located underneath this thinner layer from being exposed during dissolution, through thinning effect and/or morphological instability at high temperature.

This mask 5 is obtained in a material capable of forming a barrier against diffusion of the oxygen atoms during the dissolution thermal treatment, and it is able to withstand the conditions of thermal dissolution treatment.

The mask 5 may solely cover the ring 4, to allow subsequent so-called "full wafer" dissolution, i.e., dissolution of the oxide layer over the entire structure.

According to one variant, the mask may also be deposited on determined regions of the semiconductor layer for the purpose of local dissolution. In a particularly advantageous manner, during one same step, the mask is formed on the ring and on the regions of the semiconductor layer underneath which it is not desired to dissolve the oxide.

The forming of this mask 5 can be obtained using conventional photolithography techniques.

Typically, the mask-forming method comprises the following successive steps:
  forming a layer of material intended to form the mask 5 over the entire surface of the semiconductor layer 3 by deposit;
  depositing a layer of photoresist over the entire surface of the preceding layer;
  local insulation of the resin through a photolithographic mask;
  selective removal of the insulated regions by dilution with a solvent, for example;
  and then, through the openings formed in the resin, etching the exposed regions of the mask layer. Etching is typically dry etching (plasma), to which the resin is resistant. The material of the mask, on the other hand, is etched by this plasma.

This example is evidently non-limiting, and any technique that can be used to form the mask 5 on the desired regions of the SOI can be used.

For example, silicon nitride (of general formula SiN comprising different possible stoichiometric coefficients) is a preferred material to form the mask 5 since it is easy to use (i.e., to deposit and then remove after dissolution treatment) and does not contaminate the silicon.

However, any other material forming a barrier against diffusion of the oxygen and withstanding the conditions of the treatment can be used for the mask 5.

The mask 5 has a typical thickness of 1 to 50 nm, and is preferably in the order of 20 nm.

After depositing the mask 5, the process, therefore, comprises a thermal dissolution treatment step, which consists of applying a thermal treatment in a neutral or controlled reducing atmosphere, and under controlled time and temperature conditions, so as to urge at least part of the oxygen of the oxide layer 2 to diffuse through the thin semiconductor layer 3, leading to controlled reduction in oxide thickness.

It is noted that with the presence of the mask 5 on the ring 4, it is possible to avoid triggering of the de-wetting and/or etch phenomenon of the SOI structure at the peripheral ring 4 and in its vicinity.

Preferably, the initial structure is chosen so that it has no, or very few, defects passing through the upper thin layer, which may expose the underlying oxide, i.e., buried layer (in this case, the term "HF defect" is used). This avoids or limits the number of points at which the phenomenon of de-wetting or etching of the oxide could be triggered by the atmosphere of the dissolution treatment.

Therefore, for an SOI (Si thin layer), substrates can be chosen having no, or less than five, "HF defects" per 300 mm wafer, which is currently an achievable defect level.

In the remainder of the description, the example used will be the application of the dissolution treatment to a structure in which the thin semiconductor layer is in silicon, i.e., a "silicon-on-insulator" (SOI) structure.

The mechanisms of oxide dissolution in an SOI structure are described in detail in the article by O. Kononchuk et al., "Internal Dissolution of Buried Oxide in SOI Wafers," Solid State Phenomena Vols. 131-133 (2008), pp. 113-118, to which reference may be made.

During the treatment, the SOI structure is placed in an oven in which a gas flow is generated to form a neutral or reducing atmosphere.

The gas flow may, therefore, contain argon, hydrogen and/or a mixture thereof.

It is important to note that the phenomenon of dissolution only occurs when there is a sufficient gradient between the concentration of oxygen in the atmosphere and the concentration of oxygen on the surface of the oxide layer.

Therefore, it is considered that the oxygen content of the atmosphere in the oven must be lower than 10 ppm which, taking leakages into account, requires an oxygen content in the gas flow of less than 1 ppb.

In this respect, reference may be made to the article by Ludsteck et al., "Growth model for thin oxides and oxide optimization," Journal of Applied Physics, Vol. 95, No. 5, Mars 2004.

These conditions cannot be obtained in a conventional oven, which generates too many leaks to allow such a low content to be reached; the oven needs to be specially designed for optimum sealing (reduced number of parts to avoid number of gaskets, use of solid parts, etc.).

On the contrary, a concentration of oxygen in the atmosphere of more than 10 ppm halts dissolution and promotes oxidation of the exposed silicon.

With an SOI, the dissolution treatment is applied at a temperature of between 1100° C. and 1300° C., preferably in the order of 1200° C. For ultrathin SOI structures (thin silicon layer of 200 Å or less), dissolution temperatures between 1050° C. and 1100° C. can be considered; these ultrathin SOI structures being particularly sensitive to the de-wetting phenomenon, it will be sought to lower the treatment temperature.

It is noted that the phenomenon of dissolution may also be observed at these low temperatures if the upper silicon layer is effectively ultrathin.

The higher the temperature, the faster the rate of oxide dissolution. However, the treatment temperature must remain lower than the melting point of silicon.

For example, to dissolve an oxide thickness of 20 Å under a thin silicon layer of 1000 Å, the thermal treatment conditions are: 1100° C. for 2 hours, 1200° C. for 10 minutes, or 1250° C. for 4 minutes. It is pointed out, however, that these values depend in particular on the residual oxygen concentration in the dissolution oven. Therefore, greater dissolved thicknesses have also been observed.

After this thermal dissolution treatment, the mask 5 can be removed by dry or wet etching.

Evidently, the mask 5 could be removed by any appropriate means known to the person skilled in the art without departing from the scope of the invention.

Figure 4:
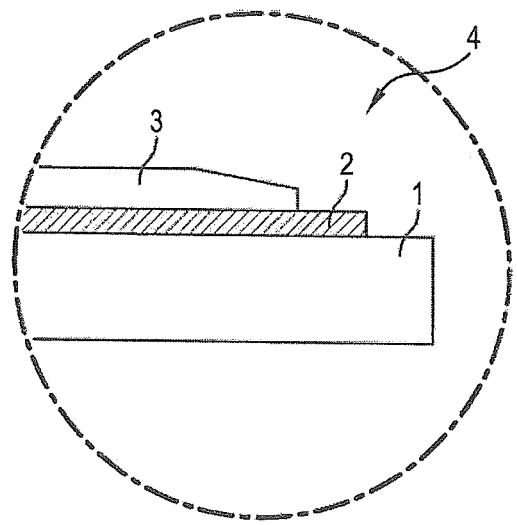
FIGS. 4 and 5 illustrate the steps of a variant of embodiment of the treatment process according to the invention.

According to one variant of embodiment of the process according to the invention and with reference to FIG. 4, prior to a dissolution treatment such as previously described, a so-called creep thermal treatment is applied to a structure of semiconductor-on-insulator (SOI) type successively comprising from its base to its surface a carrier substrate 1, an oxide layer 2, and a semiconductor layer 3; the structure also comprising a ring 4 in which the oxide layer 2 is exposed.

This creep thermal treatment consists of rapidly applying a temperature in the order of 1200° C. to the structure for a time of less than 3 minutes, the creep thermal treatment preferably being conducted in a hydrogen and/or argon atmosphere.

Figure 5:
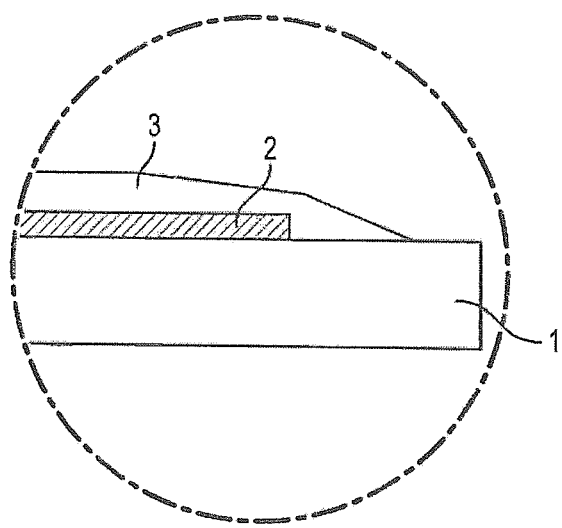

Referring to FIG. 5, this creep thermal treatment causes creep of the semiconductor layer 3 until it covers the exposed peripheral part of the buried oxide, i.e., until the semiconductor of layer 3 fully covers the oxide that was initially in contact with the atmosphere. It may also lead to masking the buried oxide at the through defects present on the surface of the wafer.

The thickness of the semiconductor material covering the oxide must be sufficient, with respect to the thickness of the oxide to be dissolved, to prevent the oxide from becoming exposed or made morphologically unstable during the dissolution treatment owing to the above-mentioned thinning of the semiconductor layer during this treatment. It is known that during the dissolution of an oxide thickness, a thickness in the order of e/2 of the surface layer is etched. It is, therefore, necessary to make provision for a surface layer having at least twice the thickness of the oxide layer that is to be dissolved, to avoid exposing the oxide layer during this dissolution and causing the onset of a three-point contact: oxide/surface layer/treatment environment.

Preferably, a thickness ratio of more than two is chosen between the oxide to be dissolved and the surface layer, e.g., six or seven.

Therefore, it is preferable for the insulator layer to have a relatively narrow thickness compared with the upper layer of semiconductor material (e.g., 10 nm buried oxide for a thin layer of 70 nm). This configuration facilitates encapsulation of the buried layer by creep of the semiconductor layer. Therefore, after creep, the thickness of the semiconductor layer at the previously exposed peripheral part of the buried oxide and in its vicinity may be greater than 10 nm, even 50 nm or more.

Also, a relatively narrow thickness of the insulator layer makes it possible to reduce the required dissolution time. It is, therefore, possible to choose an insulator thickness of between 5 nm and 50 nm, typically between 10 and 25 nm.

A thermal dissolution treatment is then applied as described previously to obtain dissolution of the oxide without causing peripheral deterioration of the structure. Intermediate steps between the creep step and the dissolution step must be avoided or limited so as not to expose the buried oxide (thinning by sacrificial oxidation, for example, or other smoothing heat treatment, etc.). Nonetheless, some cleaning or sacrificial oxidation treatment may be tolerated provided they do not cause too much thinning of the treated layer.

Under an electronic microscope, a cross-section of an SOI edge after different treatments shows the following:

cleaning before thermal treatment: the "lateral" oxide is exposed;

after this thermal treatment: the efficiency of the creep phenomenon is evidenced;

after a thinning step by oxidation/deoxidation of the preceding structure, to bring the thickness of the thin semiconductor layer to the desired final thickness, it is observed that the buried oxide is not exposed. Therefore, the structure could undergo a dissolution treatment without any risk of causing a de-wetting phenomenon.

Figure 6:
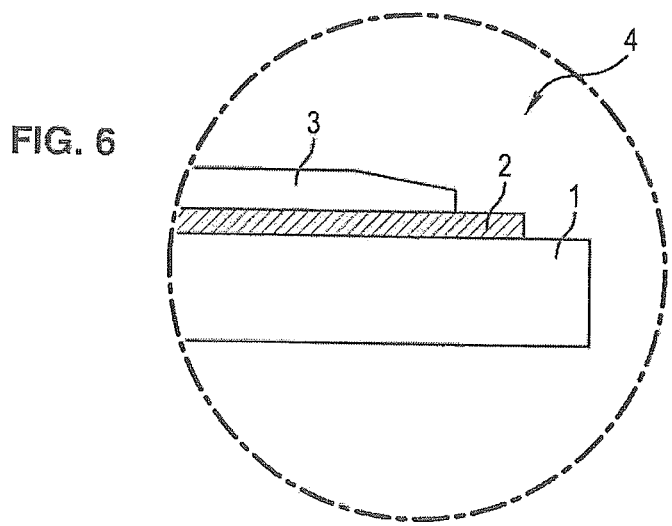
FIGS. 6 to 8 illustrate the steps of another variant of embodiment of the treatment process according to the invention.
Figure 7:
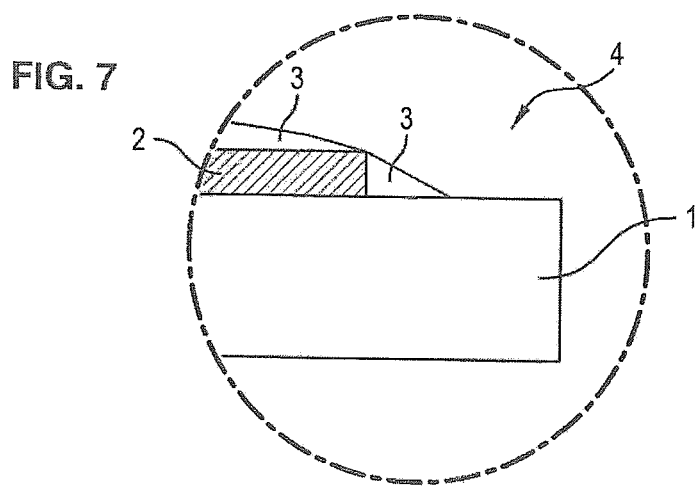
Figure 8:
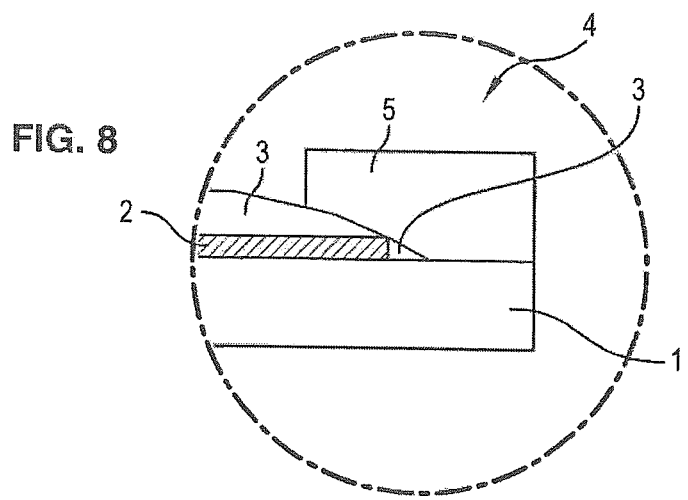

According to one last variant of embodiment of the process according to the invention and prior to a dissolution treatment, with reference to FIGS. 6 to 8, a so-called creep thermal treatment is applied in the same manner as previously described to a structure of semiconductor-on-insulator (SOI) type successively comprising from its base toward its surface, a carrier substrate 1, an oxide layer 2 and a semiconductor layer 3, the structure also comprising a ring 4 in which the oxide layer 2 is exposed.

This creep thermal treatment consists of applying a temperature in the order of 1200° C. to the structure for a time of less than 3 minutes, the creep thermal treatment preferably being conducted in a neutral or reducing atmosphere, e.g., hydrogen and/or argon.

Referring to FIG. 7, the creep thermal treatment causes creep of the semiconductor layer 3 until it covers the quasi-entirety of the ring 4, i.e., until the semiconductor of layer 3 covers most of the oxide that was initially in contact with the atmosphere. In this particular embodiment, the semiconductor layer 3, after creep thermal treatment, covers the flank of the oxide layer 2; nonetheless, the upper edge of the oxide layer 2 remains in contact with the atmosphere.

The process, with reference to FIG. 8, then comprises a step to form a mask 5 on the ring 4 so as to fully cover the oxide layer 2, i.e., all the parts of the oxide layer 2 that are in contact with the atmosphere after the creep thermal treatment.

Mask 5 is obtained in any material forming a barrier against oxygen diffusion and withstanding the conditions of dissolution thermal treatment. Additionally, it is formed using any suitable process such as described previously.

A dissolution thermal treatment is then applied such as previously described to obtain dissolution of the oxide without causing defects on the periphery of the structure. The mask 5 can then be removed by etching or any other appropriate means known to the person skilled in the art.

EXAMPLES

Example 1

Fabrication of an SOI Substrate Having a Final Buried Oxide Layer of 4 nm

First, an SOI is fabricated having an oxide layer of 10 nm and a thin layer of 3000 nm. This is obtained by:
- implanting ions in a donor substrate, bonding via an oxide layer of 10 nm onto a receiver substrate and splitting along the implanted region (standard SMARTCUT® process—registered trademark);
- "RTA" (Rapid Thermal Annealing) to smooth the surface and "encapsulate" the buried oxide on the peripheral region (and at the through-defects on the surface of the wafer);
- sacrificial oxidation of the layer to bring the surface layer to a final thickness of 2000 Å. It is verified that this step has not caused exposure of the buried oxide at the peripheral regions;
- dissolution thermal treatment at 1200° C. for around 3 hours to arrive at a buried oxide thickness of 4 nm.

On the end product, no degradation is seen in the number of defects before and after dissolution treatment, whether at the center of the wafer or on its periphery.

Example 2

An SOI substrate is provided comprising a thin layer of 300 nm and a buried oxide of 10 nm.

A dissolution mask is formed (using conventional lithography steps) to mask the regions in which the oxide layer is to be preserved. The mask also extends over the peripheral part of the wafer (a few microns either side of the oxide flank).

Dissolution thermal treatment is then conducted at 1150° C. for 1 hour to cause the buried oxide to disappear entirely at the mask openings.

The mask is then removed and it is ascertained that there is no deterioration in end defectiveness.

Finally, the examples just described are evidently only particular illustrations of the process according to the invention, and they are in no way limiting regarding the areas of application of the invention.

In particular, the invention applies to any thermal treatment conducted on a structure of SOI type when the thickness of the upper layer is relatively thin and the treatment temperature and the thickness of the semiconductor layer may possibly cause a phenomenon of de-wetting of the thin layer during the thermal treatment.

What is claimed is:

1. A process for avoiding formation of an $Si-SiO_2-H_2$ environment during a dissolution treatment of a semiconductor-on-insulator structure, which process comprises:
   providing a semiconductor-on-insulator structure successively comprising a carrier substrate, an oxide layer, a thin layer of semiconductor material and a peripheral ring in which the oxide layer is exposed, the thin layer of semiconductor having a thickness that is less than 500 nm, the thickness of the oxide layer being less than 100 nm;
   encapsulating at least the exposed oxide layer of the peripheral ring with semiconductor material by performing a creep thermal treatment; and
   performing an oxide dissolution treatment and dissolving at least a portion of the thickness of the oxide layer, the oxide dissolution treatment including subjecting the semiconductor-on-insulator structure to a temperature between 1050° C. and 1300° C. in a neutral or reducing atmosphere having an oxygen content lower than 10 ppm and avoiding formation of an $Si-SiO_2-H_2$ environment on the peripheral ring;
   wherein the thickness of the thin layer of semiconductor material of the semiconductor-on-insulator structure, prior to the oxide dissolution treatment, is at least twice the portion of the thickness of the oxide layer that is dissolved in the oxide dissolution treatment; and
   wherein the process further comprises forming a mask on the peripheral ring in which the oxide layer is exposed after the creep thermal treatment and prior to the oxide dissolution treatment, the mask covering the exposed oxide layer such that the oxide layer is not exposed to the atmosphere during the oxide dissolution treatment.

2. The process according to claim 1, wherein a ratio of the thickness of the thin layer of semiconductor material, prior to the oxide dissolution treatment, to the portion of the thickness of the oxide layer that is dissolved in the oxide dissolution treatment is six or seven.

3. The process according to claim 1, wherein the thickness of the oxide layer prior to performing the oxide dissolution treatment is between 5 and 50 nm.

4. The process according to claim 1, wherein the thickness of the oxide layer prior to performing the oxide dissolution treatment is between 10 and 25 nm.

5. The process according to claim 1, wherein the oxide dissolution treatment is performed directly after the creep thermal treatment.

6. The process according to claim 1, further comprising thinning the thin layer of semiconductor material after the creep thermal treatment and before the oxide dissolution treatment.

7. The process according to claim 1, wherein the creep thermal treatment comprises a rapid thermal annealing process in which the semiconductor-on-insulator structure is heated at a rate of 20° C. per second or more to a final temperature on the order of 1200° C., and the final temperature is held for a time less than 3 minutes.

8. The process according to claim 1, wherein the creep thermal treatment is performed with a temperature rise of more than 20° C./second.

9. The process according to claim 1, wherein the creep thermal treatment is performed with a temperature rise of more than 50° C./second.

10. The process according to claim 8, wherein the creep thermal treatment is conducted at a final temperature for a time of less than 3 minutes.

11. The process according to claim 10, wherein the creep thermal treatment is conducted in an atmosphere of hydrogen and/or argon.

12. The process according to claim 1, wherein the oxide layer has a thickness of about 10 nm, while the thin layer has a thickness at least ten times greater than the thickness of the oxide layer.

13. The process according to claim 1, wherein the semiconductor material comprises silicon.

14. The process according to claim 13, wherein the oxide layer comprises silicon oxide.

15. The process according to claim 1, further comprising applying a smoothing thermal treatment that smoothens the exposed surface of the thin layer of semiconductor material.

16. The method according to claim 1, further comprising forming the mask such that it is localized on the peripheral ring in which the oxide layer is exposed.

17. The method according to claim 16, wherein the mask comprises silicon nitride.

18. The method according to claim 17, wherein the mask has a thickness in a range extending from 1 to 50 nm.

* * * * *